United States Patent
Watanabe et al.

(10) Patent No.: US 10,665,679 B2
(45) Date of Patent: May 26, 2020

(54) SILICON CARBIDE SEMICONDUCTOR DEVICE AND METHOD FOR MANUFACTURING SAME

(71) Applicant: Mitsubishi Electric Corporation, Chiyoda-ku (JP)

(72) Inventors: Tomokatsu Watanabe, Tokyo (JP); Shiro Hino, Tokyo (JP); Yusuke Yamashiro, Tokyo (JP); Toshiaki Iwamatsu, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 16/066,777

(22) PCT Filed: Nov. 28, 2016

(86) PCT No.: PCT/JP2016/085152
§ 371 (c)(1),
(2) Date: Jun. 28, 2018

(87) PCT Pub. No.: WO2017/138221
PCT Pub. Date: Aug. 17, 2017

(65) Prior Publication Data
US 2019/0006471 A1    Jan. 3, 2019

(30) Foreign Application Priority Data
Feb. 8, 2016    (JP) .................. 2016-021650

(51) Int. Cl.
*H01L 21/02* (2006.01)
*H01L 29/16* (2006.01)
(Continued)

(52) U.S. Cl.
CPC ...... *H01L 29/1608* (2013.01); *H01L 21/0262* (2013.01); *H01L 21/02378* (2013.01);
(Continued)

(58) Field of Classification Search
CPC ......... H01L 21/02378; H01L 21/02529; H01L 29/1608
See application file for complete search history.

(56) References Cited

U.S. PATENT DOCUMENTS

| 2004/0063276 A1* | 4/2004 | Yamamoto ........ H01L 21/02057 438/241 |
| 2006/0060917 A1 | 3/2006 | Hayashi et al. |

(Continued)

FOREIGN PATENT DOCUMENTS

| JP | 2006-86397 A | 3/2006 |
| JP | 2011-60930 A | 3/2011 |

(Continued)

OTHER PUBLICATIONS

International Search Report dated Feb. 21, 2017 in PCT/JP2016/085152 filed Nov. 28, 2016.

(Continued)

*Primary Examiner* — Lex H Malsawma
*Assistant Examiner* — Geoffrey H Ida
(74) *Attorney, Agent, or Firm* — Oblon, McClelland, Maier & Neustadt, L.L.P.

(57) ABSTRACT

A silicon carbide semiconductor device includes: an n-type drift layer 2 provided within an SiC layer 30; a plurality of p-type well regions 3; a JFET region JR serving as a part of the drift layer 2 sandwiched between the well regions 3; and a gate insulating film 6 and a gate electrode 7 at least covering the JFET region JR. The gate insulating film 6 and the gate electrode 7 include a different-element-containing region 10 containing an element that is different from elements constituting the gate insulating film 6 and the gate electrode 7.

11 Claims, 8 Drawing Sheets

(51) Int. Cl.
| | |
|---|---|
| *H01L 29/12* | (2006.01) |
| *H01L 29/78* | (2006.01) |
| *H01L 29/739* | (2006.01) |
| *H01L 21/04* | (2006.01) |
| *H01L 29/04* | (2006.01) |
| *H01L 29/08* | (2006.01) |
| *H01L 29/10* | (2006.01) |
| *H01L 29/36* | (2006.01) |
| *H01L 29/49* | (2006.01) |
| *H01L 29/66* | (2006.01) |

(52) U.S. Cl.
CPC .. *H01L 21/02529* (2013.01); *H01L 21/02634* (2013.01); *H01L 21/049* (2013.01); *H01L 21/0465* (2013.01); *H01L 29/04* (2013.01); *H01L 29/0865* (2013.01); *H01L 29/1033* (2013.01); *H01L 29/1095* (2013.01); *H01L 29/12* (2013.01); *H01L 29/36* (2013.01); *H01L 29/4916* (2013.01); *H01L 29/66068* (2013.01); *H01L 29/7393* (2013.01); *H01L 29/7395* (2013.01); *H01L 29/78* (2013.01); *H01L 29/7802* (2013.01)

(56) References Cited

U.S. PATENT DOCUMENTS

| | | | |
|---|---|---|---|
| 2007/0218663 A1* | 9/2007 | Hao | H01L 21/28176 438/532 |
| 2011/0057202 A1 | 3/2011 | Kono et al. | |
| 2013/0009256 A1 | 1/2013 | Okumura et al. | |
| 2016/0087044 A1* | 3/2016 | Iijima | H01L 29/1095 257/77 |
| 2016/0247884 A1* | 8/2016 | Ohashi | H01L 29/1608 |

FOREIGN PATENT DOCUMENTS

| | | |
|---|---|---|
| JP | 2011-114252 A | 6/2011 |
| JP | 2011-211020 A | 10/2011 |
| JP | 2013-254826 A | 12/2013 |
| JP | 2015-216348 A | 12/2015 |
| JP | 2016-157762 A | 9/2016 |

OTHER PUBLICATIONS

International Preliminary Report on Patentability and Written Opinion dated Aug. 23, 2018 in PCT/JP2016/085152 (with English translation).

* cited by examiner

F I G . 1 1
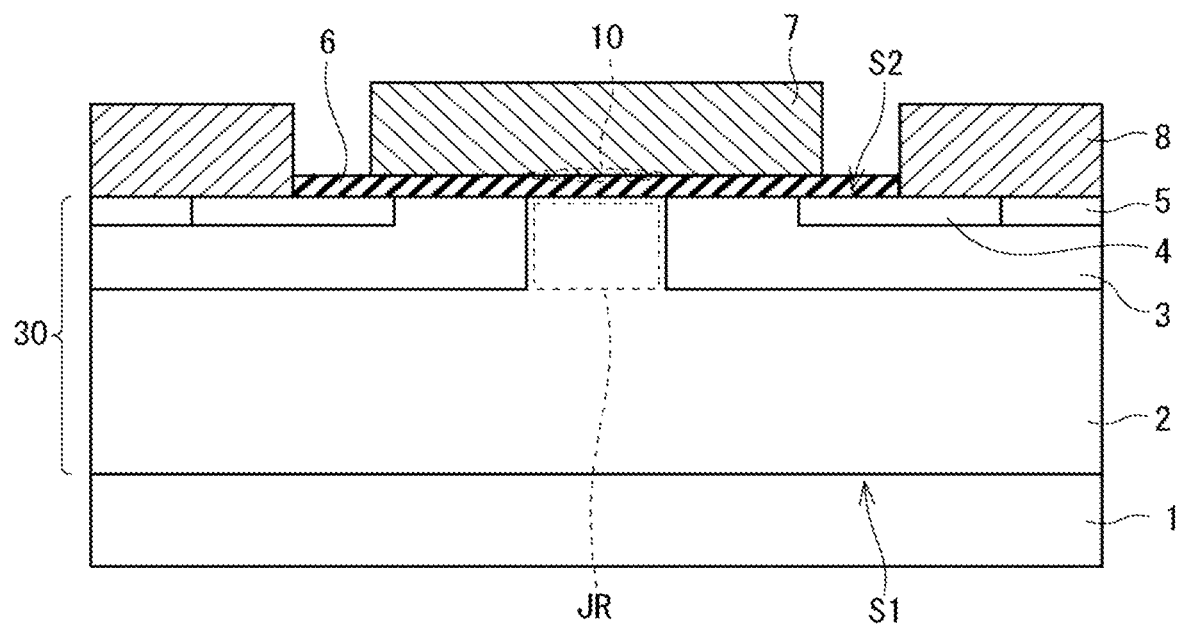

SILICON CARBIDE SEMICONDUCTOR DEVICE AND METHOD FOR MANUFACTURING SAME

TECHNICAL FIELD

The present invention relates to a silicon carbide semiconductor device and a method for manufacturing the same.

BACKGROUND ART

In recent years, a power semiconductor device using a silicon carbide semiconductor device, that is, a semiconductor device having a silicon carbide (SiC) layer has been put into practical use, and a study for improving its reliability has been conducted. Since SiC itself has high dielectric breakdown strength, a dielectric breakdown in the silicon carbide semiconductor device easily occurs not in the SiC layer but in an insulating film provided thereon. Hence, it is important to prevent degradation of the insulating film to secure the reliability. Particularly, in a silicon carbide semiconductor device having an insulated gate structure, such as a MOSFET (Metal Oxide Semiconductor Field Effect Transistor) and IGBT (Insulated Gate Bipolar Transistor), it is desirable to prevent a dielectric breakdown of a gate insulating film.

An SiC-MOSFET or an SiC-IGBT serving as a practical power semiconductor device normally has p-type well regions facing each other with an n-type drift layer in between. A part of the drift layer sandwiched between the well regions is also referred to as a JFET (Junction-Field-Effect-Transistor) region. When the power semiconductor device is in an off state, a high electric field is applied to a gate insulating film located on the JFET region. Because of this, a dielectric breakdown of the insulating film especially easily occurs in a gate electrode on the JFET region, and various techniques for preventing this have been proposed (for example, the following Patent Documents 1 to 3).

Patent Documents 1 to 3 disclose a configuration in which a p⁻ region is formed in an upper center of a JFET region in a MOSFET (a part where a threading dislocation exists in Patent Document 3). According to this configuration, when the MOSFET is in an off state, depletion of an upper part of the JFET region is promoted, thereby suppressing electric field strength applied to a gate insulating film at the upper part of the JFET region. Therefore, a breakdown of the gate insulating film when high voltage is applied to a semiconductor device can be prevented.

PRIOR ART DOCUMENTS

Patent Documents

Patent Document 1: Japanese Patent Application Laid-Open No. 2011-060930
Patent Document 2: Japanese Patent Application Laid-Open No. 2011-211020
Patent Document 3: Japanese Patent Application Laid-Open No. 2013-254826

SUMMARY

Problem to be Solved by the Invention

In the techniques in Patent Documents 1 to 3, since the p⁻ region (an electric field relaxation region) exists at a part of the JFET region, a breakdown of the gate insulating film when the MOSFET is off can be prevented. However, when the MOSFET is on, since traveling of carrier electrons is obstructed by the p region, there is concern over an increase in on-resistance.

Meanwhile, inventors of the present invention have found that a breakdown of a gate insulating film when a MOSFET is off is caused by the following mechanism. When the MOSFET is off, an electric potential of an interface between a JFET region and the gate insulating film is higher than electric potentials of a source electrode and a gate electrode. Accordingly, an electric field is generated in the gate insulating film, thereby slightly tunnel-leaking carrier electrons from the gate electrode to the gate insulating film. The tunnel-leaked carrier electrons are accelerated by a high electric field within the gate insulating film and are implanted into an SiC layer. At that time, the carrier electrons that have obtained high energy cause impact ionization within the SiC layer. Holes generated at this time are accelerated by the electric field and collided with the gate insulating film or implanted again into the gate insulating film, thereby causing time degradation of the gate insulating film and leading to the breakdown of the gate insulating film.

The present invention has been made to solve the above-described problem, and an object thereof is to provide a silicon carbide semiconductor device capable of suppressing degradation of a gate insulating film and preventing a breakdown of the gate insulating film.

Means to Solve the Problem

A silicon carbide semiconductor device according to the present invention includes: a silicon carbide layer; a drift layer of a first conductivity type provided within the silicon carbide layer; a plurality of well regions of a second conductivity type selectively provided in an upper layer part of the silicon carbide layer, the second conductivity type being different from the first conductivity type; a JFET region serving as a part of the drift layer sandwiched between the plurality of well regions and reaching an upper surface of the silicon carbide layer; an insulating film provided on the silicon carbide layer and at least covering the JFET region; and an electrode provided on the JFET region via the insulating film. The insulating film and the electrode include a region containing an element that is different from elements constituting the insulating film and the electrode.

Effects of the Invention

According to the present invention, since a leak of carrier electrons from an electrode to an insulating film is suppressed, degradation of the insulating film resulting from the leak of the carrier electrons can be prevented.

BRIEF DESCRIPTION OF DRAWINGS

FIG. 11 is a process view illustrating the method for manufacturing the silicon carbide semiconductor device according to the one exemplary embodiment of the present invention.

DESCRIPTION OF EMBODIMENT

Exemplary Embodiment 1

Hereinafter, an exemplary embodiment of the present invention is described based on the drawings. Note that identical reference numbers are assigned to identical or corresponding parts in the following drawings, and description thereof is not repeated.

Figure 1:
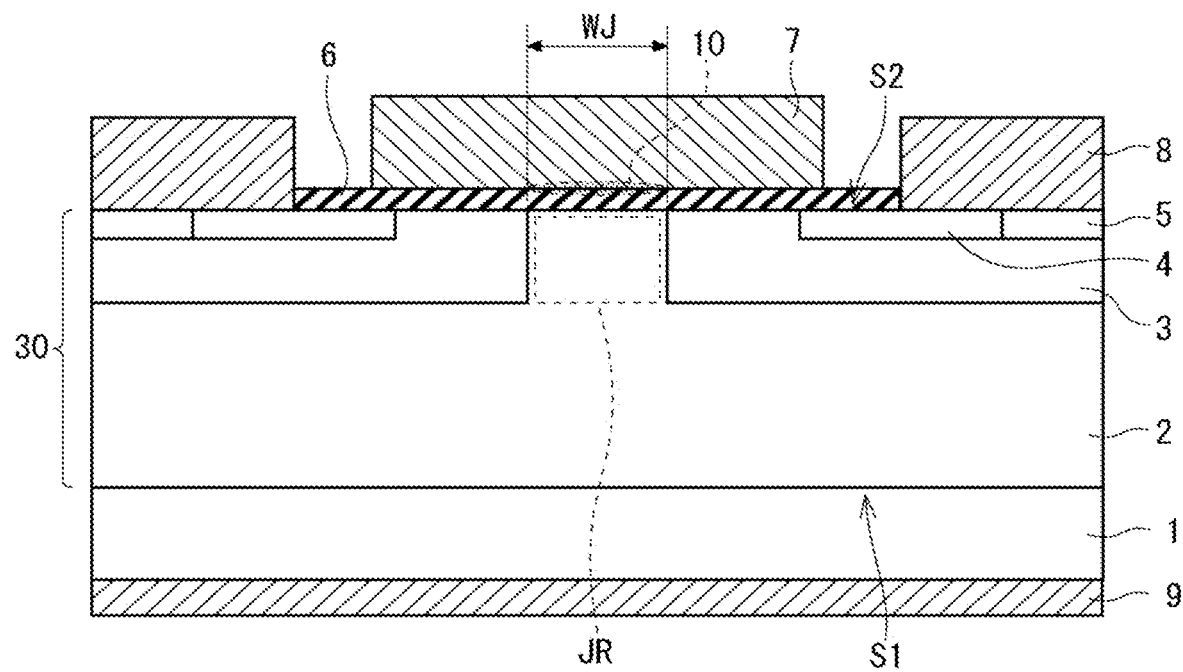
FIG. 1 is a partial sectional view schematically illustrating a configuration of a unit cell of a silicon carbide semiconductor device according to one exemplary embodiment of the present invention.

FIG. 1 is a view illustrating a configuration of a MOSFET serving as a silicon carbide semiconductor device according to the present exemplary embodiment, and a partial sectional view illustrating a part of a unit cell of the MOSFET. As illustrated in FIG. 1, the MOSFET includes an SiC substrate 1 (a silicon carbide substrate), an SiC layer 30 (a silicon carbide layer), a gate insulating film 6 (an insulating film), a gate electrode 7 (an electrode), a source electrode 8, and a drain electrode 9.

The SiC substrate 1 is an n-type (a first conductivity type) substrate made from SiC. A concentration of an n-type impurity of the SiC substrate 1 is higher than an impurity concentration of a drift layer 2 described below. Hence, resistivity of the SiC substrate 1 is lower than resistivity of the drift layer 2. Further, the SiC substrate 1 has a single crystal structure, and has its crystal structure of a hexagonal system, preferably a polytype of 4H. A plane direction of an upper surface (a surface on the SiC layer 30 side) of the SiC substrate 1 is a (0001) or (000-1) plane.

The SiC layer 30 is provided on the upper surface of the SiC substrate 1. Herein, in the SiC layer 30, a surface facing the SiC substrate 1 is defined as "a lower surface S1" (a first surface), and a surface on its opposite side is defined as "an upper surface S2" (a second surface). As in FIG. 1, the SiC layer 30 includes the n-type drift layer 2, a plurality of p-type (second conductivity type) well regions 3, a plurality of n-type source regions 4, and a plurality of p-type contact regions 5. A thickness of the SiC layer 30 is, for example, 1 to 100 μm.

The drift layer 2 reaches the upper surface S2 of the SiC layer 30 at a part between the well regions 3. Further, a bottom part of the drift layer 2 reaches the lower surface S1 of the SiC layer 30. Therefore, a maximum thickness of the drift layer 2 corresponds to the thickness of the SiC layer 30 and is for example, 1 to 100 μm. Further, a part sandwiched between the adjacent well regions 3 in the drift layer 2 is a JFET region JR. The JFET region JR has a width WJ on the upper surface S2 of the SiC layer 30 in a direction in which the well regions 3 are adjacent to each other (a lateral direction in FIG. 1).

The well region 3 is partially (selectively) formed in an upper layer part of the SiC layer 30 and reaches the upper surface S2 of the SiC layer 30 at a part where the source region 4 and the contact region 5 are not formed (a part between the source region 4 and the JFET region JR). Further, a depth (a thickness) of the well region 3 is smaller than the thickness of the SiC layer 30. Hence, the well region 3 is apart from the lower surface S1 of the SiC layer 30.

The source region 4 is formed apart from the JFET region JR in an upper layer part of the well region 3. The source region 4 reaches the upper surface S2 of the SiC layer 30. Further, a depth (a thickness) of the source region 4 is smaller than the thickness of the well region 3. Hence, the source region 4 is also apart from the drift layer 2 under the well region 3.

The contact region 5 is formed adjacent to the source region 4 in the upper layer part of the well region 3. The contact region 5 reaches the upper surface S2 of the SiC layer 30 and also reaches the well region 3. However, a depth (a thickness) of the contact region 5 is smaller than the thickness of the well region 3. Hence, the contact region 5 is apart from the drift layer 2 under the well region 3.

As is clear from the above, an upper surface of the JFET region JR which is a part of the drift layer 2, an upper surface of the well region 3, an upper surface of the source region 4, and an upper surface of the contact region 5 are partially included in the upper surface S2 of the SiC layer 30. Further, the lower surface S1 of the SiC layer 30 corresponds to a lower surface of the drift layer 2.

The gate insulating film 6 is provided on the upper surface S2 of the SiC layer 30 and has an opening part to expose a part of the upper surface of the source region 4 and the upper surface of the contact region 5. Conversely, the upper surface of the JFET region JR, an upper surface of a part between the JFET region JR and the source region 4 in the well region 3, and an upper surface of a remaining part of the source region 4 (a part that is not exposed to the opening part) are covered with the gate insulating film 6. The gate insulating film 6 is, for example, formed from silicon oxide ($SiO_2$).

The gate electrode 7 is provided on the gate insulating film 6. As in FIG. 1, the gate electrode 7 is disposed so as to face the JFET region JR and the part between the JFET region JR and the source region 4 in the well region 3 via the gate insulating film 6. In the present exemplary embodiment, the gate electrode 7 is constituted of silicon, and includes any of phosphorus (P), arsenic (As), antimony (Sb), boron (B), and gallium (Ga) as impurity dopant.

The gate insulating film 6 and the gate electrode 7 include a different-element-containing region 10, to which an element different from elements constituting the gate insulating film 6 and the gate electrode 7 (hereinafter referred to as a "different element") is added, near a boundary between the gate insulating film 6 and the gate electrode 7. In the present exemplary embodiment, the different-element-containing region 10 is provided only in an upper part of the JFET region JR. In other words, an interface between the gate electrode 7 and the gate insulating film 6 in a region outside of a region directly above the JFET region JR does not contain the above-described different element. Note that the impurity dopant introduced into the gate electrode 7 is also included in "an element constituting the gate electrode 7".

Further, in the present exemplary embodiment, the different element constituting the different-element-containing region 10 is an element with higher electronegativity (a negative element) than any element constituting the gate electrode 7. Carbon (C), nitrogen (N), fluorine (F), sulfur (S), chlorine (Cl), selenium (Se), bromine (Br), iodine (I), or the like can be used as a negative element species. Further, a surface density of the different element in the different-element-containing region 10 is within a range from $1 \times 10^{13}$ $cm^{-2}$ to $1 \times 10^{15}$ $cm^{-2}$ inclusive, and a concentration peak value of the different element in the different-element-containing region 10 is, for example, within a range from $1 \times 10^{20}$ $cm^{-3}$ to $1 \times 10^{22}$ $cm^{-3}$ inclusive.

The source electrode 8 is formed on the upper surface S2 of the SiC layer 30 and is in contact with the source region 4 and the contact region 5 within the opening part of the gate insulating film 6. The source electrode 8 is an electrode forming an ohmic junction with the source region 4 and the contact region 5.

The drain electrode 9 is formed so as to be in contact with a lower surface of the SiC substrate 1. In other words, the drain electrode 9 is disposed facing the lower surface S1 of the SiC layer 30 via the SiC substrate 1. The drain electrode 9 is an electrode forming an ohmic junction with the SiC layer 30 via the SiC substrate 1.

Next, a method for manufacturing the MOSFET illustrated in FIG. 1 is described with reference to process views in FIG. 2 to FIG. 11. Note that a visual field in each process view corresponds to a visual field in FIG. 1.

Figure 2:
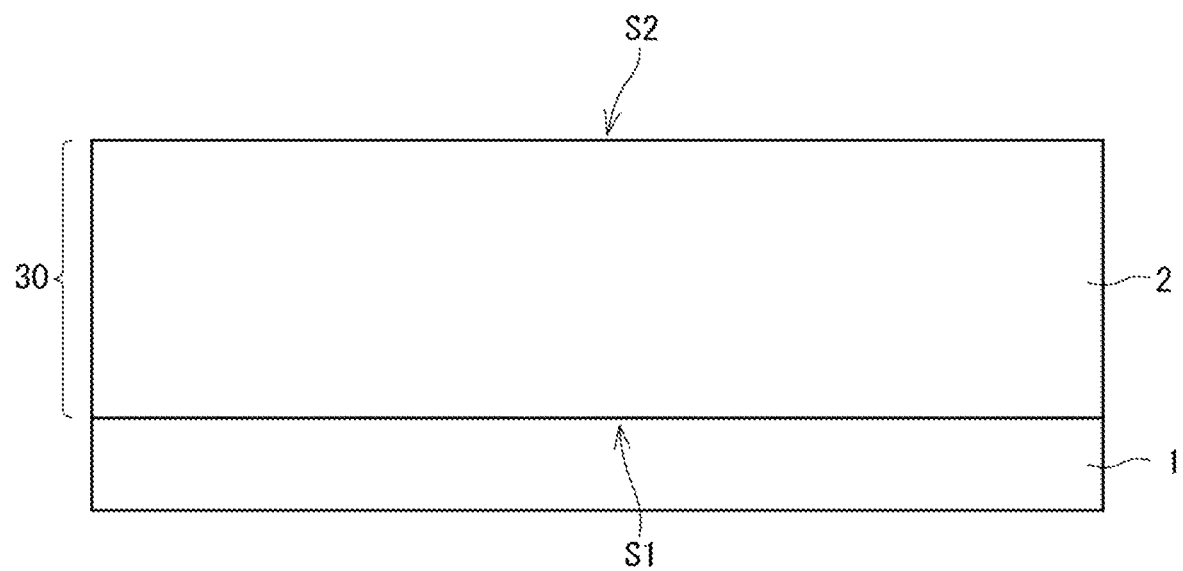
FIG. 2 is a process view illustrating a method for manufacturing the silicon carbide semiconductor device according to the one exemplary embodiment of the present invention.

First, the SiC substrate 1 whose plane direction of the upper surface is a (0001) plane or a (000-1) plane is prepared, and the SiC layer 30 is formed on the upper surface of the SiC substrate 1 by epitaxial growth. Thus, the SiC layer 30 having the lower surface S1 facing the SiC substrate 1 and the upper surface S2 on its opposite side is obtained (FIG. 2). The epitaxial growth to form the SiC layer 30 can be performed according to, for example, a CVD (Chemical Vapor Deposition) method. At this time, the SiC layer 30 is formed as the n-type drift layer 2 by introducing an n-type impurity (a donor) into the SiC layer 30. A concentration of the n-type impurity (a donor concentration) introduced into the SiC layer 30 (the drift layer 2) is, for example, within a range from $1 \times 10^{15}$ $cm^{-3}$ to $1 \times 10^{18}$ $cm^{-3}$ inclusive.

Figure 3:
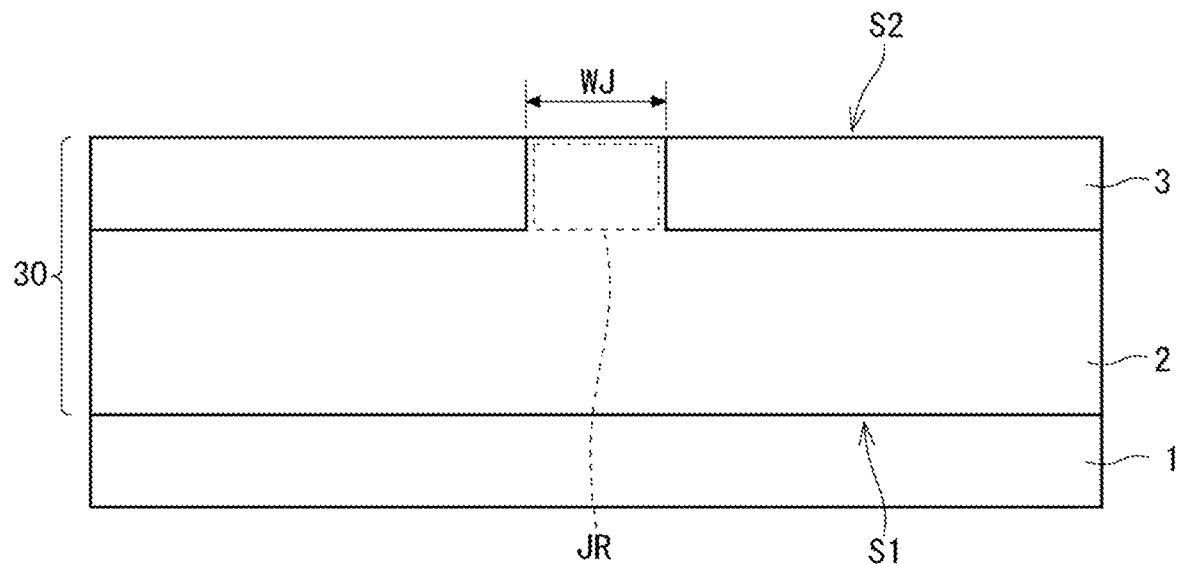
FIG. 3 is a process view illustrating the method for manufacturing the silicon carbide semiconductor device according to the one exemplary embodiment of the present invention.

Next, a resist mask (not illustrated) in which parts above well region 3 formation regions are opened is formed on the upper surface S2 of the SiC layer 30, and a p-type impurity (an acceptor) is ion-implanted into the SiC layer 30 from above the resist mask. Thereby, the plurality of well regions 3 is selectively formed in the upper layer part of the SiC layer 30 (FIG. 3). Further, the part sandwiched between the adjacent well regions 3 in the drift layer 2 is defined as the JFET region JR. An interval between the well regions 3 corresponds to the width WJ of, the JFET region JR, and a width of the interval is defined by a width of the resist mask. After that, the resist mask is removed.

For example, aluminum (Al), boron (B), or gallium (Ga) is used as the p-type impurity constituting the well region 3, and its concentration (an acceptor concentration) is higher than the donor concentration of the drift layer 2 and is, for example, within a range from $1 \times 10^{15}$ $cm^{-3}$ to $1 \times 10^{19}$ $cm^{-3}$ inclusive. Further, a depth of ion-implantation of the p-type impurity is in a range smaller than the thickness of the drift layer 2 and is, for example, about 0.5 to 3 µm.

Figure 4:
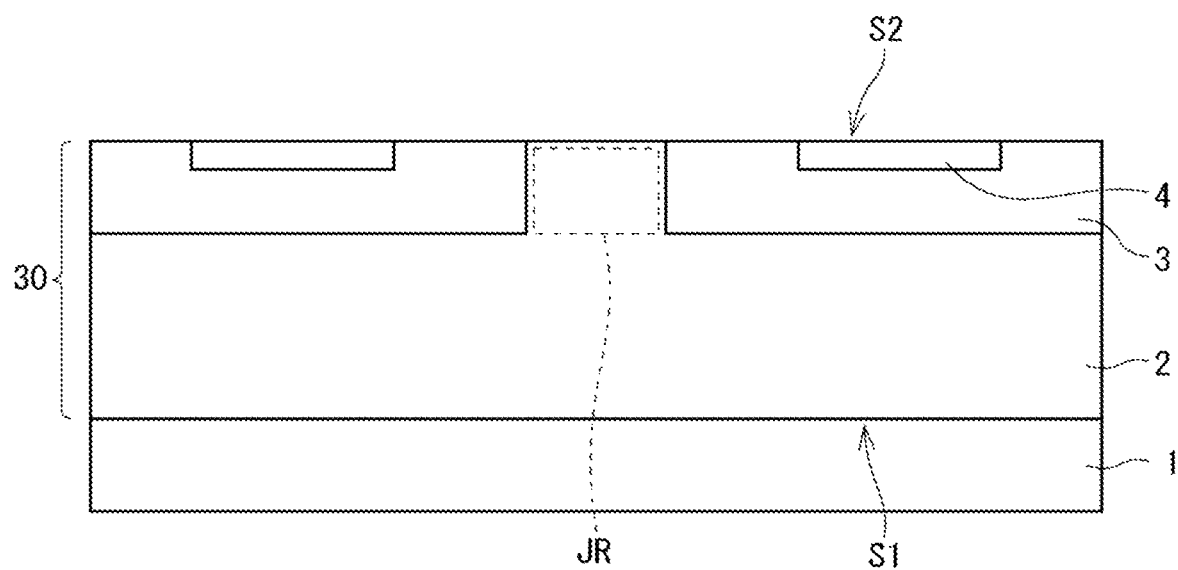
FIG. 4 is a process view illustrating the method for manufacturing the silicon carbide semiconductor device according to the one exemplary embodiment of the present invention.

Subsequently, a resist mask (not illustrated) in which parts above source region 4 formation regions are opened is formed on the upper surface S2 of the SiC layer 30, and an n-type impurity (a donor) is ion-implanted into the SiC layer 30 from above the resist mask. Thereby, the source region 4 is selectively formed in the upper layer part of each well region 3 (FIG. 4). After that, the resist mask is removed.

For example, nitrogen, phosphorus, or arsenic is used as the n-type impurity constituting the source region 4, and its concentration is, for example, within a range from $1 \times 10^{18}$ $cm^{-3}$ to $1 \times 10^{20}$ $cm^{-3}$. Further, a depth of ion implantation of the n-type impurity is in a range smaller than the thickness of the well region 3 and is, for example, about 0.1 to 2 µm.

Figure 5:
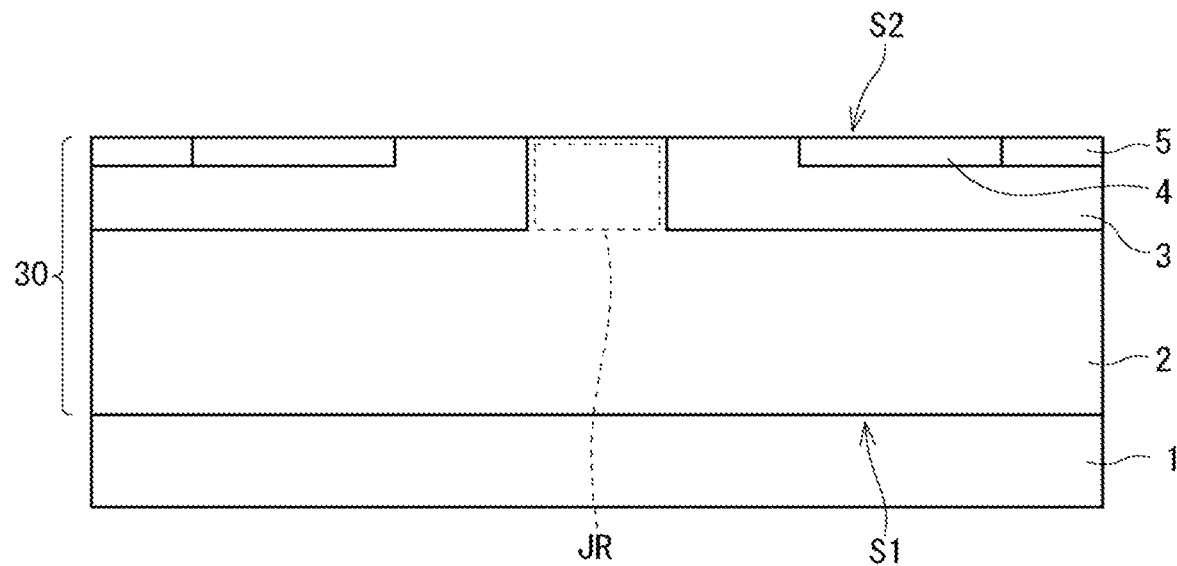
FIG. 5 is a process view illustrating the method for manufacturing the silicon carbide semiconductor device according to the one exemplary embodiment of the present invention.

Next, a resist mask (not illustrated) in which parts above contact region 5 formation regions are opened is formed on the upper surface S2 of the SiC layer 30, and a p-type impurity is ion-implanted into the SiC layer 30 from above the resist mask. Thereby, the contact region 5 is selectively formed at a position adjacent to the source region 4 in the upper layer part of each well region 3 (FIG. 5). After that, the resist mask is removed.

For example, aluminum, boron, or gallium is used as the p-type impurity constituting the contact region 5, and its concentration is, for example, within a range from $1 \times 10^{19}$ $cm^{-3}$ to $1 \times 10^{21}$ $cm^{-3}$. Further, a depth of ion implantation of the p-type impurity is in a range smaller than the thickness of the well region 3 and is about 0.1 to 2.1 µm. Further, it is desirable that a depth of the contact region 5 be larger than a depth of the source region 4 so that the contact region 5 sufficiently reaches the well region 3.

After the SiC layer 30 including the drift layer 2, the well region 3, the source region 4, and the contact region 5 is formed in this way, heat treatment (annealing) using a heat treatment apparatus is performed on the SiC substrate 1 provided with the SiC layer 30. This heat treatment is performed in an atmosphere of inert gas, for example, argon within a range of 1300 to 2100° C. Thus, the impurities ion-implanted into the SiC layer 30 in each of the above-described processes are electrically activated.

Figure 6:
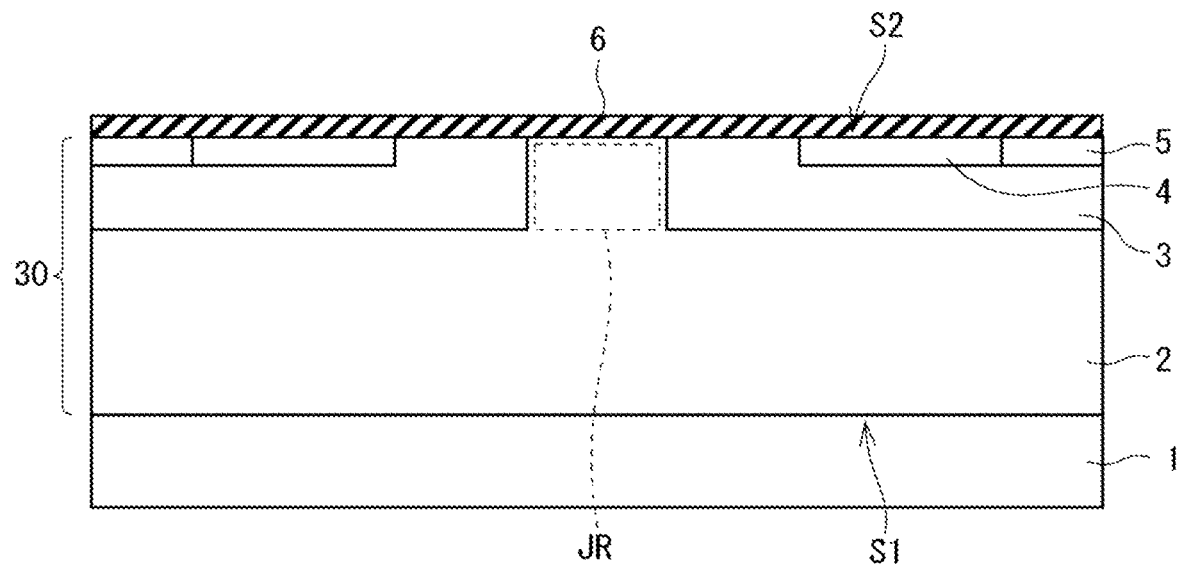
FIG. 6 is a process view illustrating the method for manufacturing the silicon carbide semiconductor device according to the one exemplary embodiment of the present invention.

After that, thermal oxidation treatment at a temperature within a range from 700 to 1400° C. or lamination treatment by a deposition method, such as a CVD method, is performed onto the upper surface S2 of the SiC layer 30, thereby forming the gate insulating film 6 on the upper surface S2 of the SiC layer 30 (FIG. 6). A film thickness of the gate insulating film 6 is within a range from 10 to 200 nm.

Figure 7:
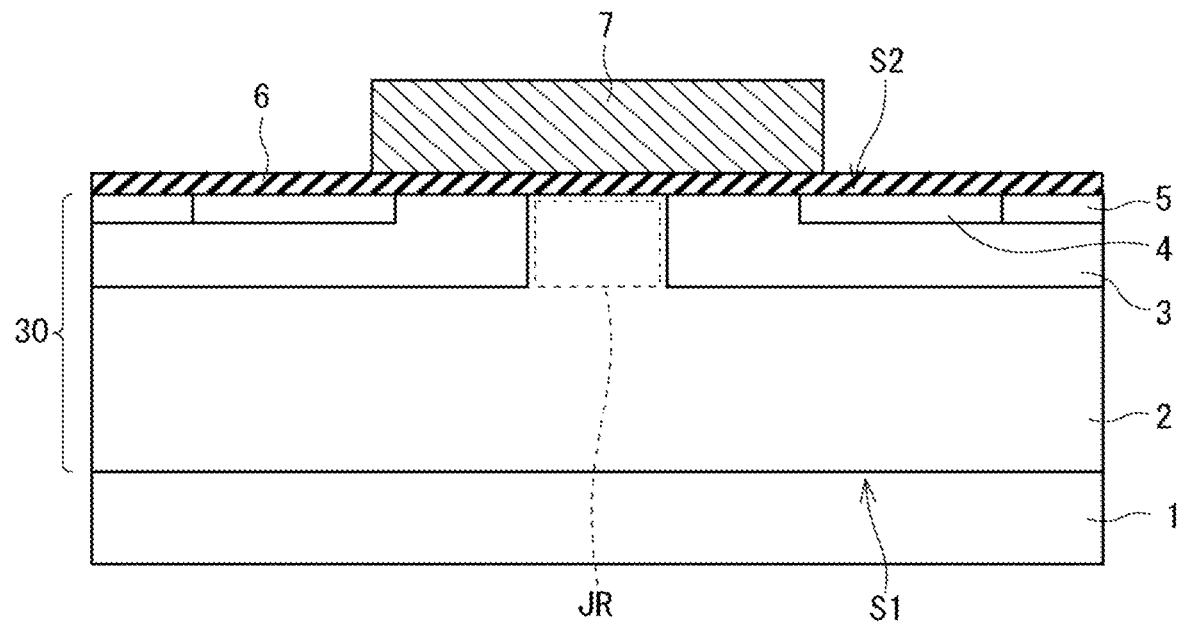
FIG. 7 is a process view illustrating the method for manufacturing the silicon carbide semiconductor device according to the one exemplary embodiment of the present invention.

Subsequently, a polycrystalline silicon (polysilicon) film is deposited on the gate insulating film 6 by, for example, the CVD method, and the polycrystalline silicon film is patterned by using a photolithography technique and an etching technique, thereby forming the gate electrode 7 (FIG. 7). The gate electrode 7 is patterned so that both ends are located on the adjacent source regions 4 in a sectional view. In other words, in the sectional view, the gate electrode 7 is formed across the adjacent source regions 4 so as to cover the well region 3 and the JFET region JR therebetween.

Figure 8:
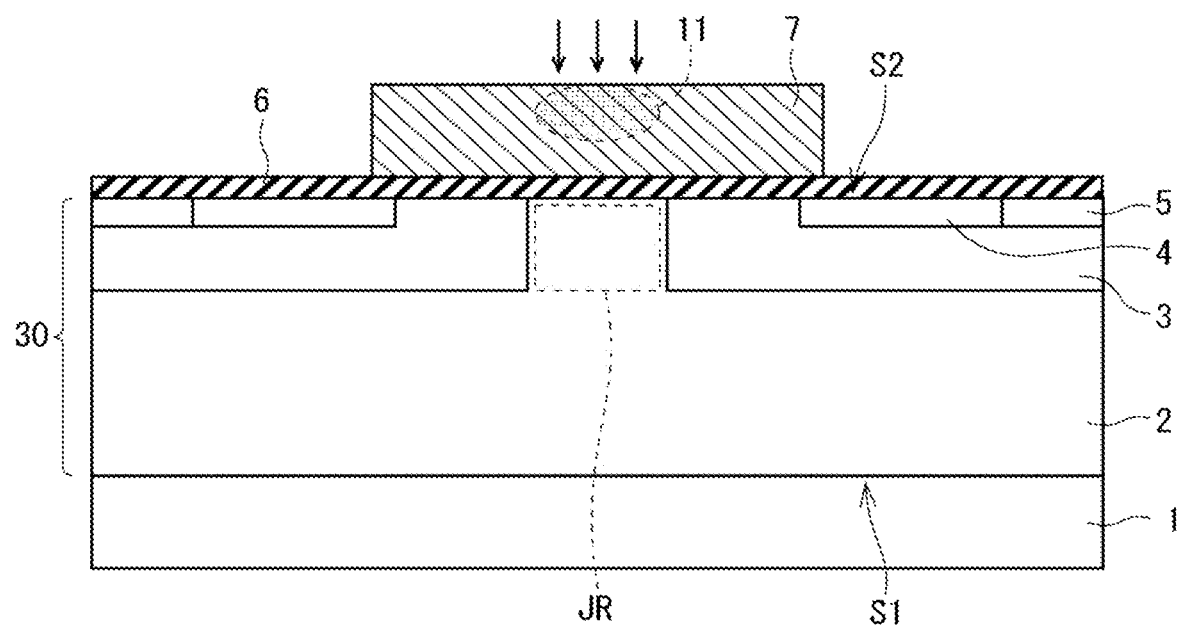
FIG. 8 is a process view illustrating the method for manufacturing the silicon carbide semiconductor device according to the one exemplary embodiment of the present invention.

Next, a resist mask in which a part directly above the JFET region JR is opened is formed on the SiC layer 30 formed with the gate insulating film 6 and the gate electrode 7. As the element, different from the elements constituting the gate insulating film 6 and the gate electrode 7 (the different element), the element with higher electronegativity (the negative element) than any element constituting the gate electrode 7 is ion-implanted from above the resist mask so as to be added to the gate electrode 7. Thereby, a region 11 into which the different element is implanted (a different-element-implanted region) is formed in the part directly above the JFET region JR in the gate electrode 7 (FIG. 8). After that, the resist mask is removed. Herein, for example, carbon, nitrogen, fluorine, sulfur, chlorine, selenium, bromine, iodine, or the like is used as a different element species, and its implantation dose amount is from $1\times10^{13}$ $cm^{-2}$ to $1\times10^{15}$ $cm^{-2}$ inclusive.

Figure 9:
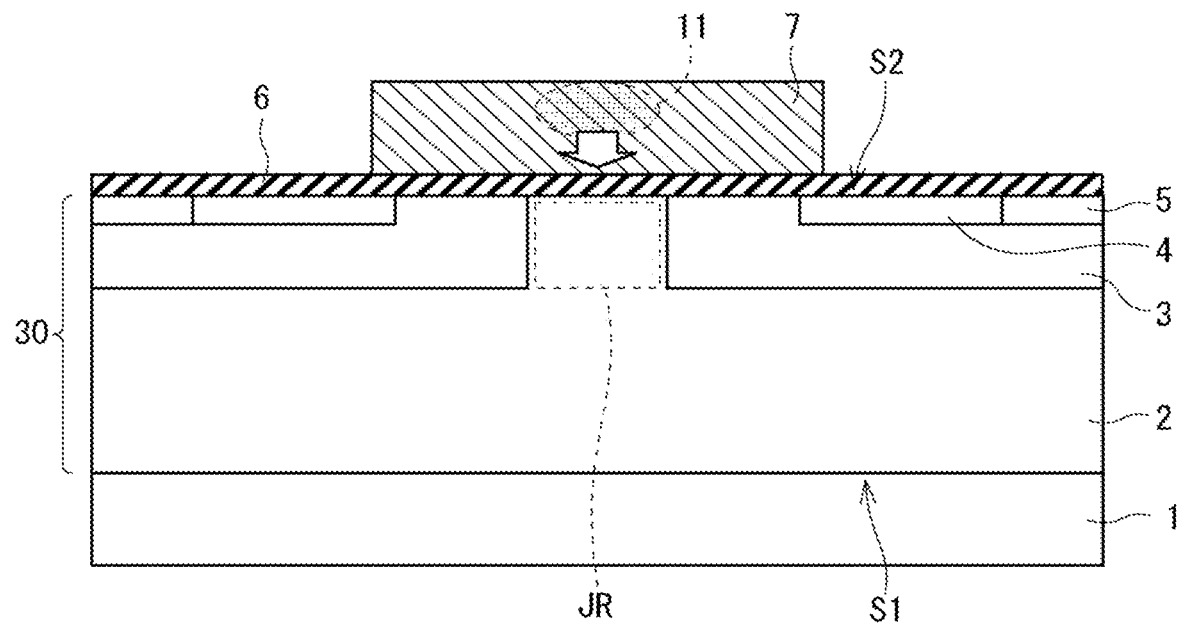
FIG. 9 is a process view illustrating the method for manufacturing the silicon carbide semiconductor device according to the one exemplary embodiment of the present invention.
Figure 10:
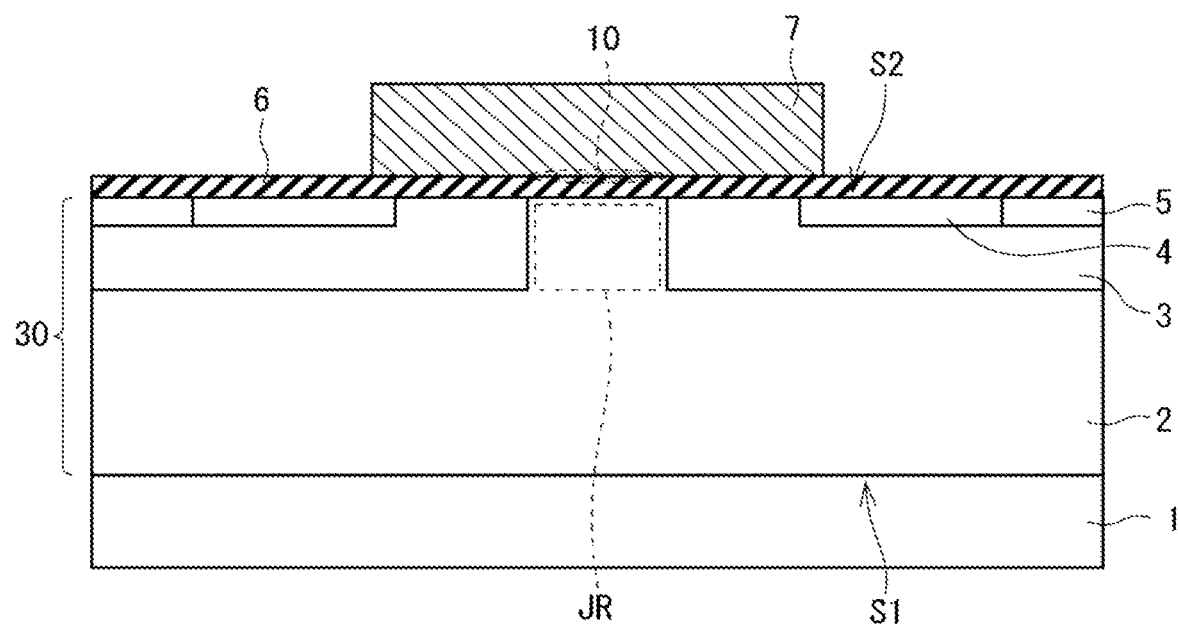
FIG. 10 is a process view illustrating the method for manufacturing the silicon carbide semiconductor device according to the one exemplary embodiment of the present invention.

Subsequently, heat treatment (annealing) using the heat treatment apparatus is performed on the SiC substrate 1 provided with the gate electrode 7 including the different-element-implanted region 11. This heat treatment is performed in an atmosphere of inert gas, for example, nitrogen or argon within a range of 800 to 1100° C. Thus, the different element in the different-element-implanted region 11 is thermally diffused and is diffused toward the interface between the gate electrode 7 and the gate insulating film 6 (FIG. 9). The gate insulating film 6 has a much lower impurity diffusion coefficient than the polycrystalline silicon film constituting the gate electrode 7. Accordingly, diffusion of the different element is stopped on the interface between the gate electrode 7 and the gate insulating film 6, and the different-element-containing region 10 formed of the different element is formed at a boundary between the gate insulating film 6 and the gate electrode 7 directly above the JFET region JR (FIG. 10). As a result, a concentration peak of the different element in the different-element-containing region 10 is located within a range of 100 nm vertically from the interface between the gate electrode 7 and the gate insulating film 6.

After that, the gate insulating film 6 is patterned, and an opening part reaching the source region 4 and the contact region 5 is formed. The source electrode 8 is formed in the opening part so as to cross the exposed source region 4 and contact region 5 (FIG. 11). For example, nickel, titanium, aluminum, molybdenum, chromium, platinum, tungsten, tantalum, niobium, silicon or titanium carbide, a nitride thereof, or an alloy thereof is used as a material of the source electrode 8.

Then, the drain electrode 9 is formed on the lower surface of the SiC substrate 1. A material of the drain electrode 9 may be the same as the material of the source electrode 8.

After that, heat treatment for alloying each of the source electrode 8 and the drain electrode 9 and the silicon carbide in contact with these is performed. This heat treatment can be performed, under conditions of, for example, a temperature of 950 to 1000° C., a treatment time of 20 to 60 seconds, and a temperature rising speed of 10 to 25° C./sec. As above, the MOSFET according to the present exemplary embodiment illustrated in FIG. 1 is completed.

Effects obtained by the MOSFET according to the present exemplary embodiment are described below. For example, in practical use when a positive voltage is applied to the drain electrode 9, when the MOSFET is in the off state (a state in which a channel is not formed in the well region 3 between the source region 4 and the JFET region JR), a depletion layer expands to an entire element region due to reverse bias of a pn junction between the drift layer 2 and the well region 3, and the source electrode 8 and the drain electrode 9 are electrically insulated by the depletion layer. At this time, a voltage substantially the same as the above-described reverse bias is applied between the gate electrode 7 and the drain electrode 9. Further, since the drift layer 2 is in contact with the gate insulating film 6 in the JFET region JR, a high electric field is also applied to the gate insulating film 6 on the JFET region JR. In other words, when the MOSFET is, in the off state, an n-type MOS, structure in the JFET region JR is in a depletion state, and a reverse direction electric field is applied to the gate insulating film 6.

Figure 12:
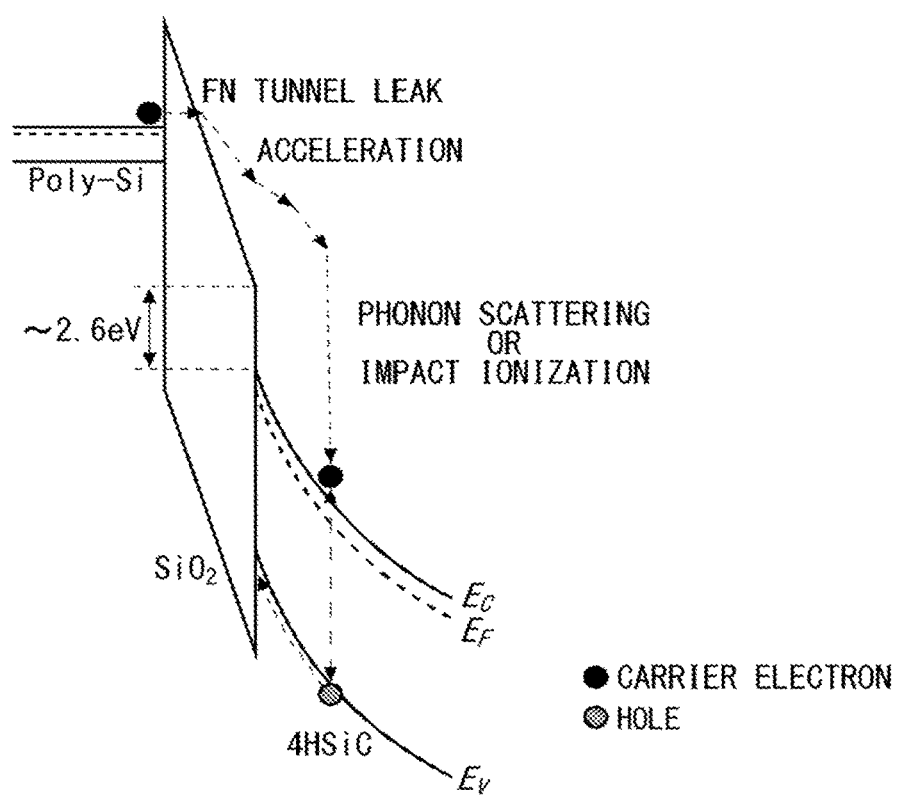
FIG. 12 is a band diagram of a MOS structure in a JFET region of a conventional silicon carbide semiconductor device when the conventional silicon carbide semiconductor device is in an off state.

FIG. 12 is a band diagram of a MOS structure in a JFET region of a conventional silicon carbide semiconductor device (MOSFET) having no different-element-containing region 10 when the conventional MOSFET is in an off state. In the conventional MOSFET, due to the above-described reverse direction electric field, as illustrated in FIG. 12, a carrier electron is implanted by an FN (Fowler-Nordheim) tunnel leak from a gate electrode 7 (Poly-Si) toward a gate insulating film 6 ($SiO_2$), thereby causing a gate leak current. The carrier electron implanted into the gate, insulating film 6 passes through the gate insulating film 6 while being accelerated by a high electric field and flows into a drift layer 2 (4H-SiC). Since this carrier electron obtains high energy, a hole is excited by impact ionization in the drift layer 2. The excited hole is accelerated within the drift layer 2 toward the gate insulating film 6, and a part of the high energy hole is implanted again into the gate insulating film 6. Note that a current amount of the carrier electron caused by the FN tunnel leak is determined by barrier energy $\Phi B$ for an FN tunnel leak.

An energy potential $\Delta\Phi_S$ generated by the different element (negative element) within the different-element-containing region 10 of the MOSFET according to the present exemplary embodiment is described herein. The different element within the different-element-containing region 10 captures surrounding electrons due to its high electronegativity and forms a negative fixed charge. Assuming that each different element captures one electron, when a surface density of the different element is $N_S$, the energy potential $\Delta\Phi_S$ generated by the different element within the different-element-containing region 10 is expressed as $\Delta\Phi_S=N_S^2/2\varepsilon_0\varepsilon_S N_D$. Herein, $\varepsilon_0$ is a vacuum dielectric constant, $\varepsilon_S$ is a relative dielectric constant of the gate electrode 7, and $N_D$ is a doping density of the different element in the gate electrode 7.

Figure 13:
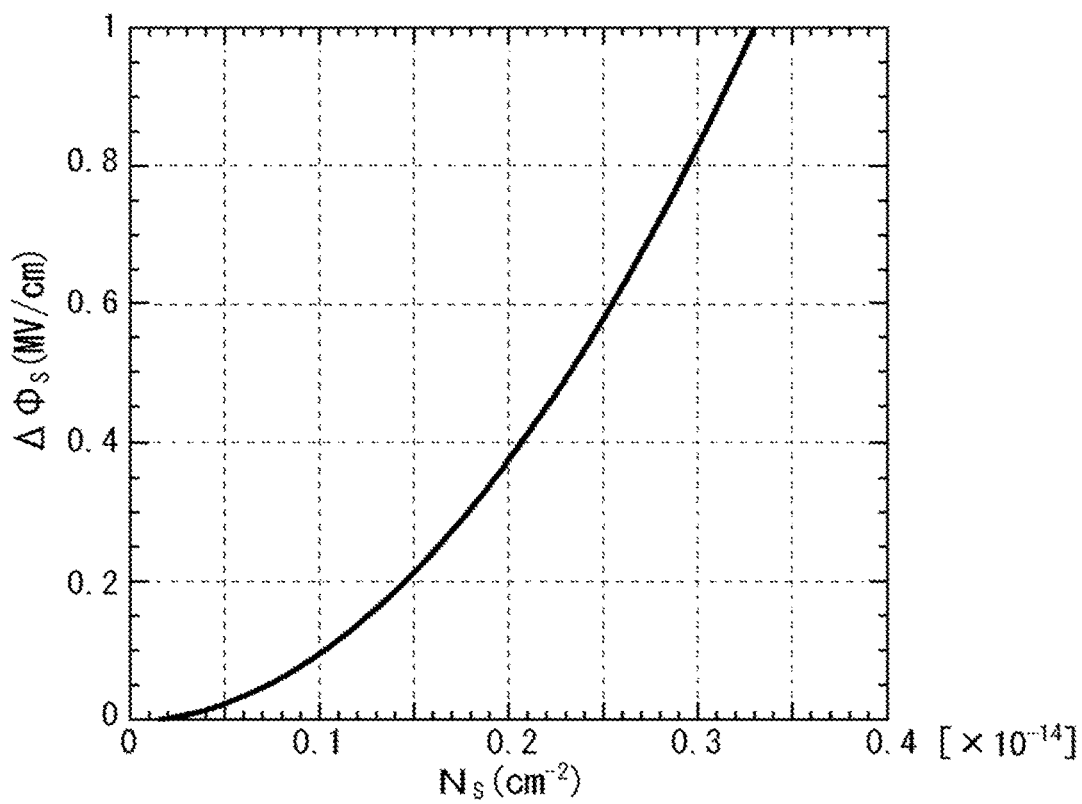
FIG. 13 is a graph illustrating dependence of an energy potential on a surface density of a different element (a negative element), when the silicon carbide semiconductor device according to the one exemplary embodiment of the present invention is in an off state.
Figure 14:
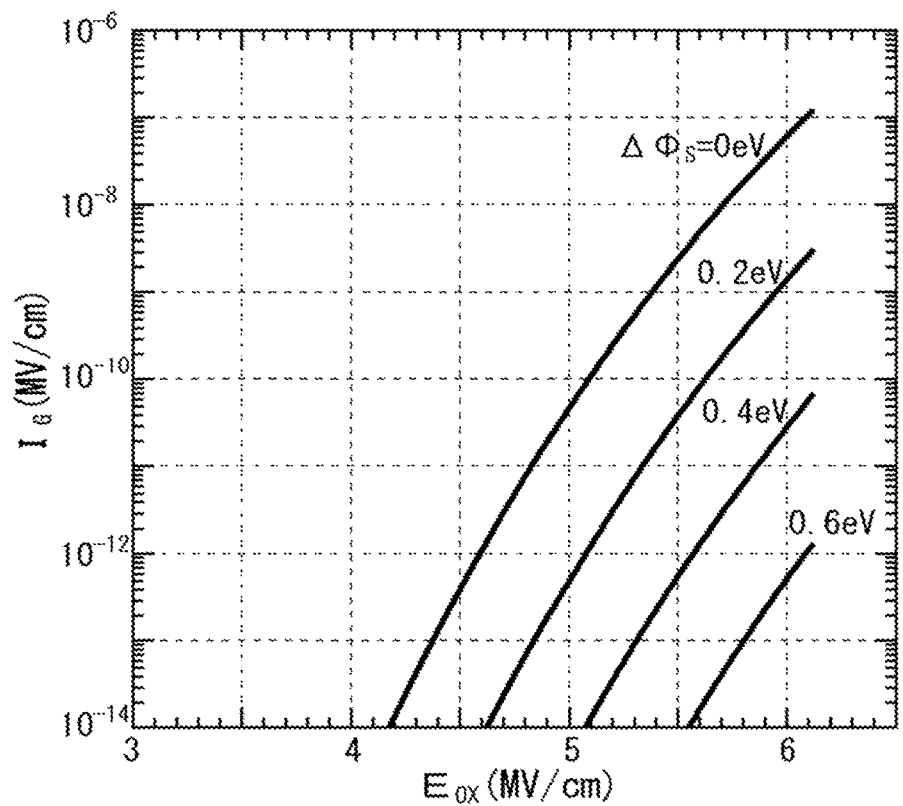
FIG. 14 is a graph illustrating dependence on the energy potential generated by the different element (the negative element) in a relationship between an electric field of a gate insulating film and a gate leak current, when the silicon carbide semiconductor device according to the one exemplary embodiment of the present invention is in the off state.

FIG. 13 illustrates dependence of the energy potential $\Delta\Phi_S$ on the surface density $N_S$ of the different element (the electronegative element). As in FIG. 13, it is found that the larger the surface density $N_S$ of the different element is, the higher the energy potential $\Delta\Phi_S$ is. When the energy potential $\Delta\Phi_S$ increases, a barrier energy $\Phi B$ for FN-tunnel-leaking the carrier electron from the gate electrode 7 to the gate insulating film 6 becomes high, and the gate leak current can be greatly reduced. FIG. 14 is a graph illustrating dependence on the energy potential $\Delta\Phi_S$ in a relationship between an electric field $E_{OX}$ of the gate insulating film 6 and a gate leak current IG. As in FIG. 14, the higher the energy potential $\Delta\Phi_S$ is, the smaller the gate leak current IG to the same electric field $E_{OX}$ is.

Figure 15:
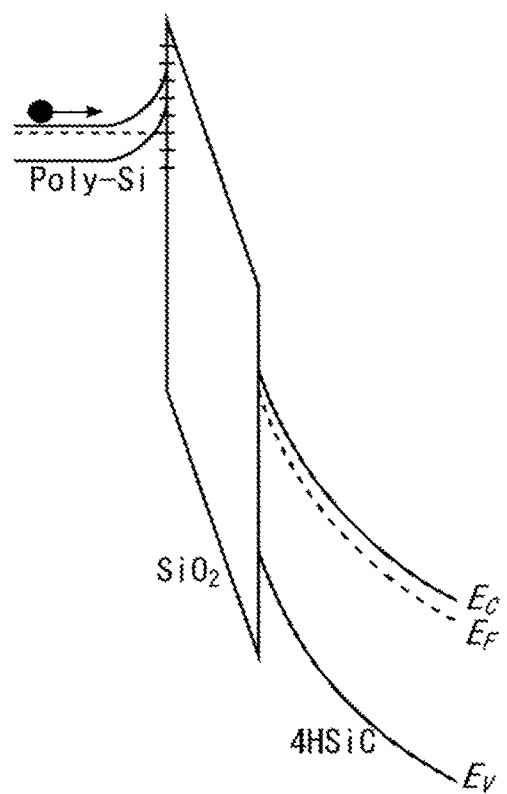
FIG. 15 is a band diagram of a MOS structure in a JFET region when the silicon carbide semiconductor device according to the one exemplary embodiment of the present invention is in the off state.

Therefore, in the MOSFET having the different-element-containing region 10, as illustrated in FIG. 15, an amount of carrier electrons flowing into the drift layer 2 is greatly reduced. Thereby, an amount of high energy holes excited in the depletion layer of the silicon carbide is greatly reduced, and re-implantation of the holes into the gate insulating film 6 is suppressed. As a result, degradation of the gate insulating film 6 is suppressed, and breakdown of the gate insulating film can be prevented. Further, unlike a case where a p-type electric field relaxation region is formed within the JFET region JR, on-resistance does not increase. Accordingly, reliability when the MOSFET is off can be improved, while deterioration of an on-characteristic of the MOSFET is prevented.

In the present exemplary embodiment, the MOSFET is described as the silicon carbide semiconductor device, to which the present invention is applied. However, application of the present invention is not limited to the MOSFET and may be applied to another MISFET (Metal Insulator Semiconductor Field Effect Transistor). Furthermore, the silicon carbide semiconductor device, to which the present invention is applied, may not be the MISFET and may be, for example, an IGBT. For example, if a conductivity type of the SiC substrate 1 in FIG. 1 is a p type, an IGBT in which the SiC substrate 1 is a collector layer can be obtained. However, the collector layer of the IGBT is not necessarily configured with a "substrate". For example, the SiC substrate 1 may be removed after a p-type region serving as the collector layer is formed in the drift layer 2 on the SiC substrate 1.

Further, in the above description, description is given while the first conductivity type is the n type and the second conductivity type is the p type. However, the conductivity types may be reversed (in other words, the conductivity types of the impurities (the donor and the acceptor) added to the respective regions may be exchanged). For example, in the MOSFET in FIG. 1, if the first conductivity type is the p type and the second conductivity type is the n type, a p-channel type MOSFET is obtained. Further, an order of ion implantation processes performed to add the respective impurities is not limited to the one described above and may be any order.

Note that in the present invention, the exemplary embodiment can be appropriately changed or omitted within a scope of the invention.

EXPLANATION OF REFERENCE SIGNS

1: SiC substrate
30: SiC layer
2: drift layer
JR: JFET region
3: well region
4: source region
5: contact region
6: gate insulating film
7: gate electrode
8: source electrode
9: drain electrode
10: different-element-containing region
11: different-element-implanted region

The invention claimed is:

1. A silicon carbide semiconductor device comprising:
a silicon carbide layer;
a drift layer of a first conductivity type provided within the silicon carbide layer;
a plurality of well regions of a second conductivity type selectively provided in an upper layer part of the silicon carbide layer, the second conductivity type being different from the first conductivity type;
a source region of the first conductivity type provided within each of the plurality of well regions;
a JFET region serving as a part of the drift layer sandwiched between the plurality of well regions and reaching an upper surface of the silicon carbide layer;
a channel region provided within each of the plurality of well regions and sandwiched between the source region and the JFET region;
an insulating film provided on the silicon carbide layer and at least covering the JFET region; and
an electrode provided on the JFET region via the insulating film,
wherein the insulating film and the electrode include a region containing a different element that is different from elements constituting the insulating film and the electrode, the region containing the different element being provided at a portion within each of the insulating film and the electrode such that the region containing the different element is embedded in a boundary between the insulating film and the electrode,
the region containing the different element is provided above the JFET region and is not provided above the channel region.

2. The silicon carbide semiconductor device according to claim 1, wherein
the different element has electronegativity higher than any of the element constituting the electrode.

3. The silicon carbide semiconductor device according to claim 1, wherein
the electrode is constituted of silicon, and includes any of phosphorus, arsenic, antimony, boron, and gallium as impurity dopant, and
the different element is any of carbon, nitrogen, fluorine, sulfur, chlorine, selenium, bromine, and iodine.

4. The silicon carbide semiconductor device according to claim 1, wherein
a surface density of the different element is from $1\times10^{13}$ cm$^{-2}$ to $1\times10^{15}$ cm$^{-2}$ inclusive.

5. The silicon carbide semiconductor device according to claim 1, wherein
a concentration peak of the different element is located within a range of 100 nm vertically from the boundary between the insulating film and the electrode.

6. A method for manufacturing a silicon carbide semiconductor device comprising:
forming a drift layer of a first conductivity type in a silicon carbide layer;
selectively forming a plurality of well regions of a second conductivity type in an upper layer part of the silicon carbide layer, the second conductivity type being different from the first conductivity type;
forming an insulating film on the silicon carbide layer so as to cover a JFET region serving as a part of the drift layer sandwiched between the plurality of well regions;

forming an electrode on the insulating film so as to cover the JFET region; and ion-implanting, into the electrode, a different element that is different from elements constituting the insulating film and the electrode, wherein the different element is any of carbon, nitrogen, fluorine, sulfur, chlorine, selenium, bromine, and iodine, wherein the different element is ion-implanted into a part above the JFET region in the electrode and the insulating film, and is not ion-implanted into a part above a channel region, wherein a region containing the different element is provided at a portion within each of the insulating film and the electrode such that the region containing the different element is embedded in a boundary between the insulating film and the electrode.

7. The method for manufacturing the silicon carbide semiconductor device according to claim 6, wherein in the ion-implanting the different element, a dose amount of the different element ion-implanted into the electrode is from $1\times10^{13}$ cm$^{-2}$ to $1\times10^{15}$ cm$^{-2}$ inclusive.

8. A method for manufacturing a silicon carbide semiconductor device comprising:

forming a drift layer of a first conductivity type in a silicon carbide layer;

selectively forming a plurality of well regions of a second conductivity type in an upper layer part of the silicon carbide layer, the second conductivity type being different from the first conductivity type;

selectively forming a source region of the first conduction type within each of the plurality of well regions;

forming an insulating film on the silicon carbide layer so as to cover a JFET region serving as a part of the drift layer sandwiched between the plurality of well regions;

forming an electrode on the insulating film so as to cover the JFET region; and ion-implanting, into the electrode, a different element that is different from elements constituting the insulating film and the electrode, wherein the different element is ion-implanted into a part above the JFET region in the electrode and the insulating film, and is not ion-implanted into a part above a channel region, wherein a region containing the different element is provided at a portion within each of the insulating film and the electrode such that the region containing the different element is embedded in a boundary between the insulating film and the electrode.

9. The method for manufacturing the silicon carbide semiconductor device according to claim 8, further comprising:

diffusing the different element by heat treatment after the step of ion-implanting the different element.

10. The method for manufacturing the silicon carbide semiconductor device according to claim 8, wherein the different element is any of carbon, nitrogen, fluorine, sulfur, chlorine, selenium, bromine, and iodine.

11. The method for manufacturing the silicon carbide semiconductor device according to claim 8, wherein in the ion-implanting the different element, a dose amount of the different element ion-implanted into the electrode is from $1\times10^{13}$ cm$^{-2}$ to $1\times10^{15}$ cm$^{-2}$ inclusive.

* * * * *